Figure 1:
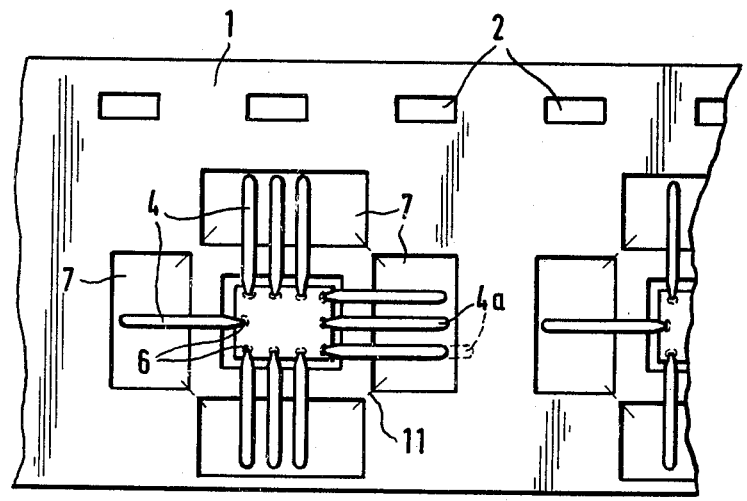

United States Patent [19]

Haghiri-Tehrani et al.

[11] Patent Number: 4,460,825
[45] Date of Patent: Jul. 17, 1984

[54] CARRIER ELEMENT FOR AN IC MODULE

[75] Inventors: Yahya Haghiri-Tehrani; Joachim Hoppe, both of Munich, Fed. Rep. of Germany

[73] Assignee: GAO Gesellschaft für Automation und Organisation mbH, Munich, Fed. Rep. of Germany

[21] Appl. No.: 328,241

[22] Filed: Dec. 7, 1981

[30] Foreign Application Priority Data

Dec. 8, 1980 [DE] Fed. Rep. of Germany ....... 3046193
Jun. 11, 1981 [DE] Fed. Rep. of Germany ....... 3123198

[51] Int. Cl.³ .................... G06K 19/02; H01R 43/00
[52] U.S. Cl. .................... 235/488; 29/827; 174/52 FP; 235/487; 235/492; 428/596; 357/70; 357/74; 228/5.1
[58] Field of Search .............. 357/69, 70, 80, 74; 29/841, 588, 827; 427/96; 174/52 FP; 156/324.4; 228/5.1; 428/571, 572; 235/488, 493, 487, 492

[56] References Cited

U.S. PATENT DOCUMENTS

| | | | |
|---|---|---|---|
| 3,611,269 | 10/1971 | Reed | 339/17 CF |
| 3,716,439 | 2/1973 | Maeda | 156/324.4 X |
| 3,754,070 | 8/1973 | Dunn et al. | 29/588 X |
| 3,838,984 | 10/1974 | Crane et al. | 174/52 FP X |
| 3,984,739 | 10/1976 | Mochizuki et al. | 174/52 FP X |
| 4,079,511 | 3/1978 | Grabbe | 29/841 X |
| 4,089,575 | 5/1978 | Grabbe | 174/52 FP X |
| 4,142,287 | 3/1979 | Grabbe | 357/74 X |
| 4,195,193 | 3/1980 | Grabbe et al. | 357/74 X |
| 4,210,462 | 7/1980 | Tourneux | 357/74 X |
| 4,216,577 | 8/1980 | Badet et al. | 228/5.1 X |
| 4,222,516 | 9/1980 | Badet et al. | 228/5.1 X |

Primary Examiner—Mark Rosenbaum
Assistant Examiner—Carl J. Arbes
Attorney, Agent, or Firm—Fleit, Jacobson, Cohn & Price

[57] ABSTRACT

A carrier element for an IC module (integrated circuit) comprising leads which are connected at one end with the corresponding terminals of the module and at the other end have a contact surface. The ends of the leads running into the contact surfaces extend unsupported beyond the edge of the carrier so that they can be bent into the desired position according to the intended purpose of the carrier element. When the leads are bent around the carrier plane towards the back surface of the module and united by using a castable material in a casting the result is a compact carrier element well adapted to the dimensions of the IC module. For the incorporation of the carrier element according to the invention into an identification card the free ends of the leads can be directed through corresponding recesses in the cover film of the card. During lamination of the layers of the identification card the ends of the leads are bent onto the cover film and thus pressed into the film material.

7 Claims, 19 Drawing Figures

CARRIER ELEMENT FOR AN IC MODULE

The invention relates to a carrier element for an IC module in which the module is attached in a window of a film-like carrier by means of a contact spider in such a way that the leads of the contact spider are each connected at one end with the corresponding terminals of the module and run into contact surfaces at the other end.

Carrier elements of this type can be used, for example, in order to incorporate IC modules into identification cards or similar data carriers. The carrier elements can alternatively also be used in those cases in which so-called dual-in-line packages are usually employed today as IC modules. When the carrier elements are incorporated into flexible data carriers such as identification cards, this involves special problems as far as both the production of the identification cards and the handling of the cards are concerned.

To protect the module and its terminal leads it has thus been proposed (German application No. 26 59 573) that the module (integrated circuit) and the lead network, the so-called contact spider, be arranged on the same, relatively rigid carrier. The contact spider consists of leads which are connected to terminals on the module at one end and run into contact surfaces on the surface of the carrier at the other end, thus allowing for communication with the module. The carrier element is only heat-sealed or glued to the identification card film at the edges.

The carrier element proposed in the German application has relatively large dimensions compared with the size of the module. This is due mainly to the contact surfaces arranged all around the module. Carrier elements having a large surface area, however, are especially vulnerable for mechanical stress, when they are incorporated into identification cards, for example.

A structural shape adapted to the size of the module is also advantageous for other applications, for example the incorporation of the carrier elements into miniaturized hybrid circuits.

The incorporation of the known carrier elements into identification cards is troublesome and unsuitable for mass production. The identification card is provided with appropriate cut outs in order to ensure the accessibility of the contact surfaces attached to the carrier. These cut outs must be filled with a conductive material if rapid contamination of the contacts is to be avoided. Apart from the additional procedural step necessary for this, such a measure also involves an additional point of contact and thus an additional source of possible disturbances, interruptions, etc. during the operation of the identification card.

The problem of the invention thus consists in proposing a carrier element of the above-mentioned kind, the size of which corresponds as closely as possible to that of the IC module, and which allows for simple integration in data carriers such as identification cards so as to be suitable for mass production.

The problem is solved according to the invention by having the leads and the contact surfaces extend beyond the edge of the carrier and be freely bendable.

The carrier elements are thus designed in such a way that the outgoing ends of the terminal leads remain freely mobile so that they can be bent into the desired position during completion and incorporation of the carrier elements.

When the ends of the leads running into the contact surfaces are bent back around the carrier plane towards the IC module or over the surface of the module, the result is a compact carrier element optimally adapted to the dimensions of the IC module.

The element can be used advantageously wherever small dimensions play an important part, such as in hybrid circuits for watches, etc.

In connection with identification cards or similar data carriers, the element can be glued into an appropriately prepared blind hole of the card in an extremely small space without any additional steps.

The small size of the carrier element ensures a high degree of safety for the handling of the card, since the surface exposed to mechanical stress is correspondingly small.

A simple production technique is possible for the incorporation of the carrier elements according to the invention into identification cards during the hot lamination process, if the free ends of the leads are first directed through prepared recesses in the cover film of the card and only bent back into the area of the cover film above the surface of the module and thus pressed into the film material during the lamination of the cover films with the other layers of the card.

The card has an excellent appearance due to the seamless transitions between the contact areas and the cover film. The carrier element mounted in the center of the card is protected optimally, whereby the module is only connected with the externally accessible contact surfaces by one point of contact.

Figure 2:
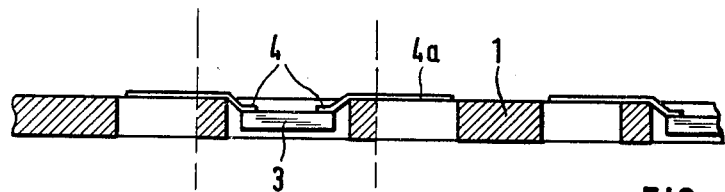
Figure 3:
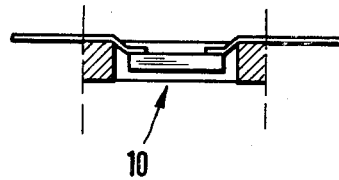
Figure 5A:
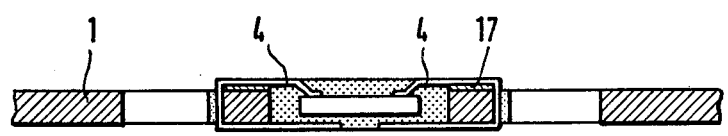
Figure 5B:
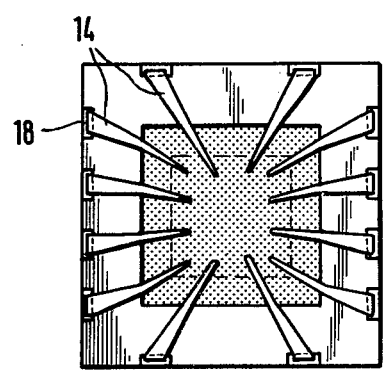
Figure 6A:
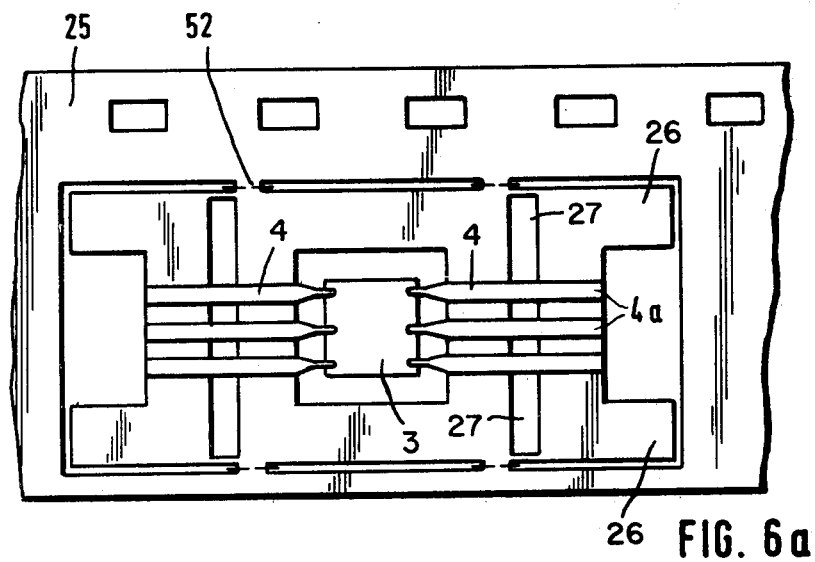
Figure 6B:
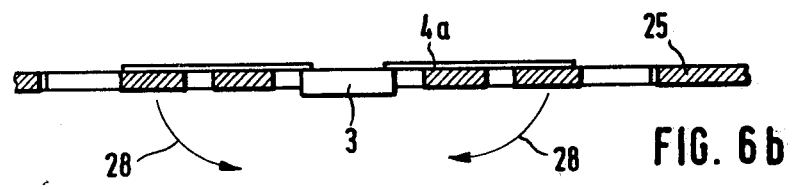
Figure 6C:
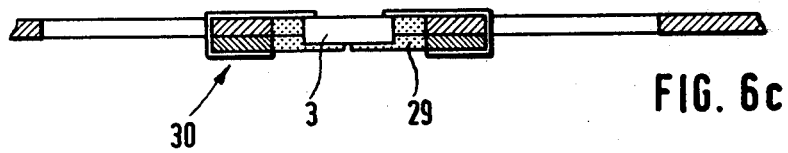
Figure 10:
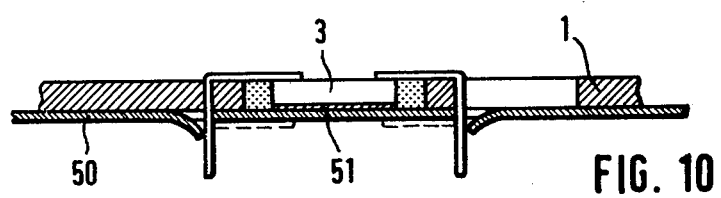
Figure 7:
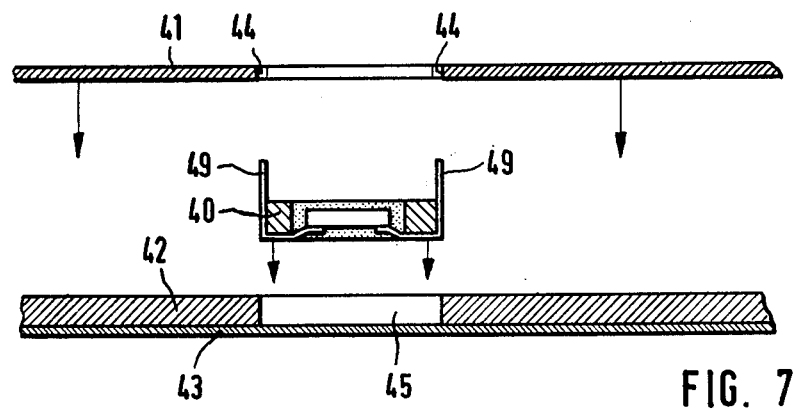
Figure 8:
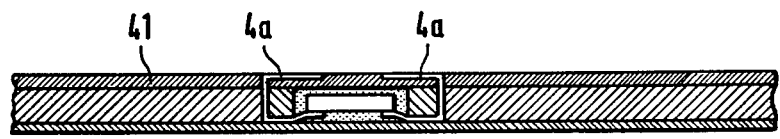
Figure 9A:
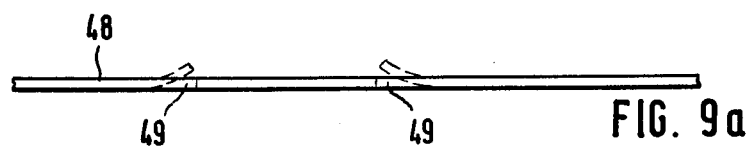
Figure 9B:
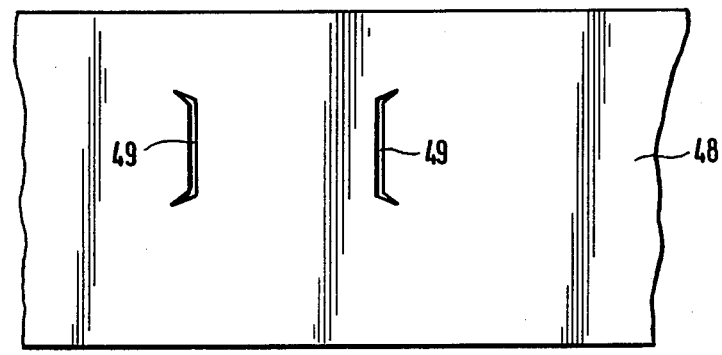
Figure 11:
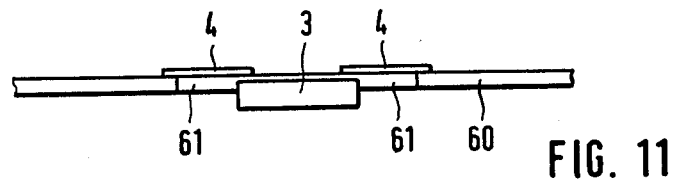
Figure 12:
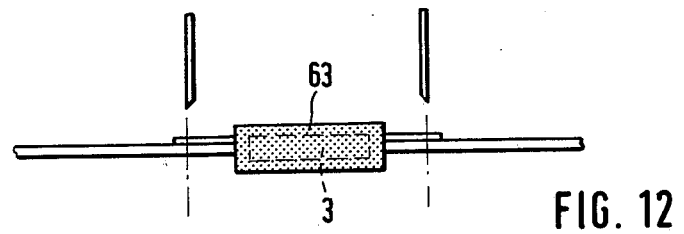
Figure 13:
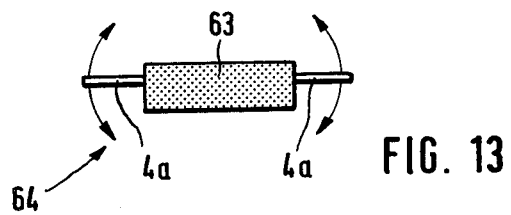
Figure 14:
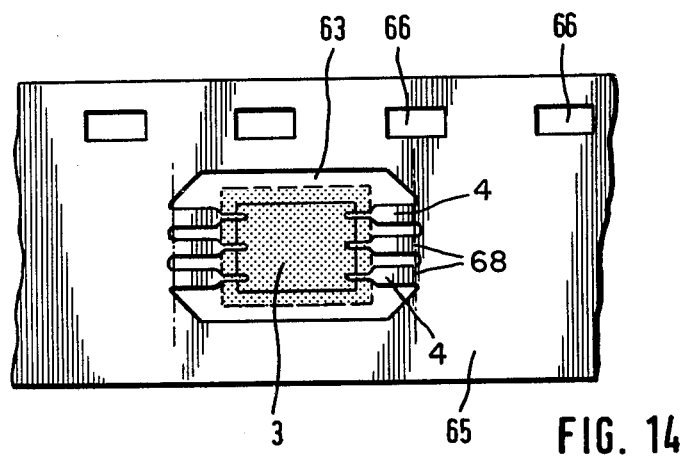

Further advantages and developments of the invention can be found in the subclaims. In the following embodiments of the carrier element are described on the basis of the adjoined drawings by way of example. These show:

FIG. 1 to FIG. 3—an example of production of the carrier element according to the invention, FIGS. 4a,4b,5a and 5b—developments of the carrier elements shown in FIGS. 1 to 3, FIGS. 6a to 6c—a carrier element having thinner carrier film relative to the module, FIGS. 7 and 8—a method of incorporating the carrier element according to the invention into identification cards and the finished identification card, FIGS. 9a,9b—an advantageous embodiment of the cover film used in the production method, FIG. 10—a carrier element in which the film bearing the module is identical to the cover film of the card, FIGS. 11,12,13—a carrier element having a cast casing as a carrier for the IC module in three phases of its production and FIG. 14—the production of a carrier element without the use of a carrier film.

FIGS. 1 to 3 show by way of example the production of the carrier element according to the invention. Film material can be used as a carrier for the IC modules. The perforation 2 which is usually present in films 1 is used for transport or adjustment of the film, for example in the contacting device, during the various production phases.

The contact spider with its leads 4 connecting the module 3 with the carrier 1 is etched out of a conductive film coating according to known methods in the embodiment shown.

It has also become known in connection with the contacting of semiconductor modules to produce the contact spider in a separate procedural step independently of the film. In this case the contact spider is only-positioned on the carrier film during the contacting process, and is connected there with the carrier and the corresponding terminals of the module.

Independently of the production of the contact spider each lead 4 is connected at one end with the corresponding terminal 6 of the module 3. The ends of the leads 4 running into the contact surfaces 4a are arranged in this embodiment of the invention so as to be freely mobile above punched out windows 7.

FIG. 2 shows the arrangement of FIG. 1 in cross-section. In the example shown, the film 1 bearing the module 3 is thicker than the module including the contacting leads 4. This construction offers optimal protection of the module and its leads.

The leads 4 are connected with the film 1 in only a relatively small area so that the ends of the leads remain freely mobile.

FIG. 3 shows the carrier element 10 punched out of the film, whereby the fins 11 shown in FIG. 1 by broken lines are cut in two. If the length of the leads 4 relative to the width of the windows 7 is selected in such a way that they span the windows (shown by broken lines in FIG. 1), the leads must also be cut during the punching process.

In the following, advantageous developments of the carrier element shown in FIGS. 1 to 3 are described.

Figure 4A:
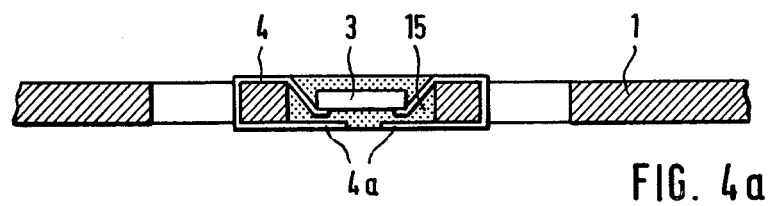
Figure 4B:
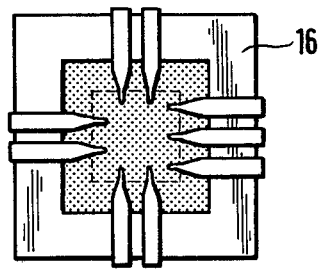

In the embodiment shown in FIGS. 4a and 4b, the ends 4a of the leads 4 are bent around the plane of the carrier 1 over the module 3. Then the hollow 15 is filled with a suitable material to protect the IC module 3 and the leads. In the process the ends 4a of the bent back leads (contact surfaces) are also filled in and thus automatically attached.

The bending of the leads and the filling of the hollows is preferably carried out on the element when it is still connected with the film, in order to simplify the procedural steps. The carrier element 16 that is finally punched out of the film is shown in FIG. 4b. As one can see, the specific design of the leads yields a very compact carrier element optimally adapted in its dimensions to the size of the IC module.

FIGS. 5a and 5b show an embodiment of the invention in which the leads of the contact spider have been produced in a separate procedural step, not in connection with the carrier film. In this case it is necessary that the leads 4 of the contact spider be connected with the carrier film 1 by an appropriate adhesive 17 before or during contacting. The bending of the leads and filling of the carrier element can be carried out as described above.

As also shown in FIG. 5b, the leads 4 are directed in this embodiment through recesses 18 provided in the edge of the carrier element as well and sealed in them. This measure supports the firmness of the connection between the leads and the carrier.

FIGS. 6a to 6c show an embodiment of the invention in which the film 25 used for contacting the module 3 is thinner than the module. As can be seen in FIG. 6a, the outgoing ends 4a of the leads 4 are arranged in this embodiment on a freely mobile portion 26 of the carrier film 25. The portion which can be moved perpendicularly to the plane of the film is punched out of the film 25 in such a way that it only remains connected with the film by the narrow fins 27. After the IC module 3 is contacted, the ends of the leads that run into the contact surfaces 4a are bent along with the portion 26 onto the reverse side of the card, as is shown by the arrows 28 in FIG. 6b. The hollow 29 surrounding the module 3 can finally be filled out.

As in the embodiments described above, the carrier element 30, which can be punched out of the film 25 by simply severing the fins 52 along the broken lines, is constructed so as to be well adapted to the size of the module. The film thickness is doubled by the method described, so that the module is arranged in the middle plane of the carrier element and is thus protected in this case as well.

In the following a method will be described with reference to FIG. 7, by which a carrier element produced according to the invention can be incorporated into identification cards or similar data carriers in a simple manner.

First the carrier element 40 is inserted in a prepared recess 45 of the card core 42, which recess is adapted to the size of the element, and held in this position by the cover film 43 on the reverse. Then the front cover film 41 is laid onto the card core 42 equipped with a carrier element 40 in such a way that the ends of the leads 4a are directed through corresponding recesses or slots 44 in the cover film. After the ends of the leads are bent back onto the front cover film 41, the various films are connected with each other and with the carrier element, for example by the hot lamination method.

As one can see in the finished, laminated identification card (FIG. 8), the ends of the leads or contact surfaces 4a of the carrier element are pressed into the front cover film 41 seamlessly. This fact gives the card a good appearance and also has the advantage that the contact surfaces can be easily kept clean.

As can also be seen in FIG. 8, the IC module is connected only by one point of contact with the contact surfaces 4a which are directed to the surface of the card and are directly accessible to peripheral equipment, which improves the reliability of operation compared to known identification cards having integrated circuits.

FIGS. 9a and 9b show an advantageous embodiment of a film 48 which can be used as a cover film in the method described above. The slots 49 in the film are designed in such a way that it is easier to direct the ends of the leads through them, as can be seen in the drawing. Furthermore, the ends of the leads are bent towards the surface of the cover film while they are being directed through the slots, so that they are automatically pressed into their definitive position by the laminating plate during the lamination process.

FIG. 10 finally shows an embodiment of the invention in which the IC module 3 is first attached by means of an appropriate adhesive 51 to a film 50 connected with the carrier film 1 before contacting. An advantage of this embodiment is that the film 50 used can serve as a cover film for the identification card shown in FIG. 8, which further simplifies the production of identification cards having integrated circuits.

FIGS. 11 to 13 show an embodiment of the invention in which a cast casing is used as a carrier for the IC module.

The module 3 is first contacted, for example as described above in connection with FIGS. 1 to 3. Then only the module arranged in a window 61 of the film 60 is provided with a cast casing 63 in a suitable casting unit (not shown in the figures). The carrier element 64 punched out of the window 61 of the film at the ends of the leads 4a is shown in FIG. 13. The ends of the leads 4a extending beyond the edge of the module carrier or cast casing 63 are freely bendable and can be bent, for example, onto the carrier or module surface.

This embodiment of the invention is characterized by a very compact structural form adapted to the dimensions of the module 3. The carrier element contains only the IC module and the leads 4 or 4a, but no longer the carrier film 60, to which the leads were attached during contacting.

FIG. 14 finally shows an embodiment of the invention in which a carrier film is not even made use of during contacting. To contact the module 3 an electrically conductive film 65 is used, out of which the leads 4 are punched or etched out, as shown in the figure. The perforation 66 allows for transportation of the film during the processing phases.

After the module is encapsulated in a cast casing 63, the actual carrier element is punched out of the film by severing the fins 68, which in this case are identical with the ends of the leads 4a. The final product has the structural form shown in FIG. 13.

What is claimed is:

1. A method for making a multi-layered identification card embodying an IC module by inserting a carrier element for an IC module in a recess thereof, said identification card comprising a card core and at least one cover film having slots formed therein, said IC module being mounted on the carrier element by means of a contact spider which includes a plurality of conductive leads having inner ends and outer ends, said IC module including a plurality of terminal pads and wherein the inner ends of the conductive leads connect to corresponding terminal pads of the IC module and the outer ends of the conductive leads protrude over the edge of the carrier element and form respective contact areas which can be bent, said method comprising the steps of:

bending the outer ends of the conductive leads to form an angle substantially perpendicular to the surface of said carrier element;

inserting said carrier element into said recess of the identification card;

applying the cover film to said identification card in a manner wherein the outer ends of the conductive leads are inserted through said slots of said cover film;

folding down the outer ends of the conductive leads onto the external surface of said cover film; and pressing together the identification card and the cover film while applying heat thereto, whereby the contact areas define external contact areas which are flush with the cover film and which provide means for electrically accessing said IC module embedded in said identification card.

2. An identification card embodying an IC module produced by the method recited in claim 1.

3. A carrier element for containing at least one IC module having respective terminal pads, said carrier element comprising a carrier film and a cover film for covering the carrier film, said carrier film having a front side, a reverse side, and at least one group of separate sections defined therein, an IC module being attached to the carrier film by means of a contact spider which includes a plurality of conductive leads having inner ends and outer ends, the inner ends of the contact spider being connected to corresponding terminal pads of the IC module and whereas the outer ends of the conductive leads protrude over the edge of the carrier film so that the outer ends may be freely bent, the outer ends thereby defining external contact areas which penetrate correspondingly arranged slots in said cover film, the outer ends protruding through said slots and being folded so that they lie on an outer surface of said cover film, whereby to define said external contact areas for electrically accessing said IC module embedded in said carrier element.

4. A carrier film as recited in claim 3 wherein the cover film has two slots opposed to each other about said IC module, each having relief sections defined by a cut-out having an angle of approximately 45° with respect to the direction of said slot, whereby to reduce destructive effects of inserting said conductive leads through said slots during assembly of said carrier element.

5. A carrier element comprising a strip of carrier film for containing at least one IC module having terminal pads, said carrier film having a front side, a reverse side, and at least one pair of separately foldable separate sections spaced away from said IC module, said module being attached to said carrier film by means of a contact spider comprising a plurality of conductive leads having inner ends and outer ends, the inner ends of the contact spider being connected to corresponding terminal pads of the IC module and the outer ends of the contact spider defining external contact areas, said contact areas being mounted on the groups of separately foldable separate sections of said carrier film and being freely movable with said separate sections so that said separate sections can be folded onto the reversed side of the carrier film, whereby to form external contact areas on said carrier element when the film is folded to form said carrier element.

6. A carrier element as recited in claim 5 wherein each group of separate film sections carrying the contact areas has such a contour that when folded onto the reverse side of said film, the thickness of the carrier film constituting the carrier element is doubled.

7. A carrier element as recited in claim 5 wherein an IC mocule is encased in a molding material.

* * * * *